(12) United States Patent
Vermeeren

(10) Patent No.: US 10,763,784 B2
(45) Date of Patent: Sep. 1, 2020

(54) TRANSMISSION SYSTEM

(71) Applicant: NXP B.V., Eindhoven (NL)

(72) Inventor: Petrus Antonius Thomas Marinus Vermeeren, Eindhoven (NL)

(73) Assignee: NXP B.V., Eindhoven (NL)

(*) Notice: Subject to any disclaimer, the term of this patent is extended or adjusted under 35 U.S.C. 154(b) by 108 days.

(21) Appl. No.: 15/935,047

(22) Filed: Mar. 25, 2018

(65) Prior Publication Data

US 2018/0358926 A1  Dec. 13, 2018

(30) Foreign Application Priority Data

Jun. 9, 2017 (EP) .................................. 17175346

(51) Int. Cl.
| | |
|---|---|
| *H03B 27/00* | (2006.01) |
| *H03B 5/20* | (2006.01) |
| *H03B 5/26* | (2006.01) |
| *H04B 3/54* | (2006.01) |
| *H04L 25/02* | (2006.01) |
| *H04L 12/40* | (2006.01) |

(52) U.S. Cl.
CPC ............... *H03B 5/20* (2013.01); *H03B 5/26* (2013.01); *H04B 3/548* (2013.01); *H04L 25/0286* (2013.01); *H03B 2201/025* (2013.01); *H04L 2012/40234* (2013.01)

(58) Field of Classification Search
CPC ...... H03B 5/20; H03B 2201/025; H03B 5/26; H04L 2012/40234; H04L 25/0286; H04B 3/548; H04B 1/40; H03H 11/16

USPC ................................................ 331/45, 57
See application file for complete search history.

(56) References Cited

U.S. PATENT DOCUMENTS

| | | | | |
|---|---|---|---|---|
| 6,157,694 | A  * | 12/2000 | Larsson ................ | H03K 23/68 327/115 |
| 6,194,971 | B1 * | 2/2001 | Glen ...................... | H03L 7/081 327/156 |
| 7,064,620 | B1 | 6/2006 | Lai et al. | |
| 7,362,187 | B1 * | 4/2008 | Lai ........................ | H03K 3/0322 331/45 |
| 7,408,421 | B2 * | 8/2008 | Ahsan ................... | H03K 3/0315 219/494 |
| 8,044,729 | B2 * | 10/2011 | Chen .................... | H03K 3/0315 331/17 |

(Continued)

FOREIGN PATENT DOCUMENTS

EP    2 099 184 A1    9/2009

OTHER PUBLICATIONS

Offner, F. et al. "The two-section RC phase-shift oscillator", Proceedings of the IEEE, vol. 52, No. 6, pp. 739-740 (Jun. 1964).

(Continued)

*Primary Examiner* — Richard Tan
(74) *Attorney, Agent, or Firm* — Rajeev Madnawat

(57) ABSTRACT

A transmission system comprising: an output-terminal configured to provide an output-signal; a phase-shift oscillator comprising a plurality of phase-shifters, each configured to provide one of a plurality of phase-shifted-signals; and a controller configured to provide a selected one of the phase-shifted-signals to the output-signal as a transition in the output-signal, at an instant in time that is based on one or more of the plurality of phase-shifted-signals.

15 Claims, 9 Drawing Sheets

(56) References Cited

U.S. PATENT DOCUMENTS

2002/0171497 A1    11/2002  Forbes et al.
2010/0001784 A1*    1/2010  Moussavi ............. H03L 7/0995
                                                          327/512
2010/0156544 A1*    6/2010  Lee ...................... H03K 3/0322
                                                          331/57
2014/0097856 A1*    4/2014  Chen .................. G01R 31/2884
                                                          324/617

OTHER PUBLICATIONS

Mancini, R. "Design of op amp sine wave oscillators", Analog Applications Journal, Analog and Mixed-Signal Products, Amplifiers: Op Amps, Texas Instruments Incorporated, pp. 33-37 (Aug. 2000).
Vittoz, E, "Micropower switched-capacitor oscillator", IEEE Journal of Solid-State Circuits, vol. 14, No. 3, pp. 622-624 (Jun. 1979).
Nahin, P. "The two-section RC phase-shift oscillator", Proceedings of the IEEE, vol. 52, No. 2, p. 198 (Feb. 1964).

* cited by examiner

TRANSMISSION SYSTEM

CROSS-REFERENCE TO RELATED APPLICATIONS

This application claims the priority under 35 U.S.C. § 119 of European Patent application no. 17175346.0, filed on Jun. 9, 2017, the contents of which are incorporated by reference herein.

The present disclosure relates to transmission systems, such as LIN (Local Interconnect Network) transmission systems, and more particularly to systems for providing a transition in an output-signal of the transmission system.

According to a first aspect of the present disclosure there is provided a transmission system comprising:
- an output-terminal configured to provide an output-signal;
- a phase-shift oscillator comprising a plurality of phase-shifters, each configured to provide one of a plurality of phase-shifted-signals; and
- a controller configured to provide a selected one of the phase-shifted-signals to the output-signal as a transition in the output-signal, at an instant in time that is based on one or more of the plurality of phase-shifted-signals.

In one or more embodiments, the controller is configured to provide the selected one of the phase-shifted-signals to the output-signal as a transition in the output-signal, at an instant in time that is based on: (i) one or more of the plurality of phase-shifted-signals that are not selected; and/or (ii) the selected one of the phase-shifted-signals.

In one or more embodiments, the plurality of phase shifted-signals comprise raised-cosine waveforms.

In one or more embodiments, the transmission is configured to selectively provide one of the plurality of phase-shifted-signals as the selected phase-shifted-signal at an instant in time that is in advance of, or coincides with, the selected phase-shifted-signal having a transition-predetermined-value. The transition-predetermined-value may comprise a peak-value.

In one or more embodiments, the transmission system is configured to selectively provide one of the plurality of phase-shifted-signals as the selected phase-shifted-signal at an instant in time that is in advance of, or coincides with, one of the non-selected phase-shifted-signals having a non-selected-transition-value. The non-selected phase-shifted-signal may be 90° out of phase with the selected phase-shifted-signal, and the non-selected-transition-value may be a middle-value.

In one or more embodiments, the transmission system is configured to selectively provide one of the plurality of phase-shifted-signals as the selected phase-shifted-signal at an instant in time that is in advance of, or coincides with, two of the non-selected phase-shifted-signals having a middle-value, wherein the two non-selected phase-shifted-signals are 90° out of phase with the selected phase-shifted-signal. The transmission system may further comprise a comparator configured to compare the two non-selected phase-shifted-signals with each other to determine the instant in time that is in advance of, or coincides with, the two non-selected phase-shifted-signals having a middle-value.

In one or more embodiments, the transmission system further comprises:
- a switching-block comprising:
  - an output-switch configured to selectively connect one of: (i) a high-terminal, (ii) a transition-terminal; and (iii) a low-terminal to the output-terminal, wherein:
    the high-terminal is configured to a receive a high-signal,
    the transition-terminal is configured to receive the selected phase-shifted-signal, and
    the low-terminal is configured to a receive a low-signal.

The controller may be configured to control the output-switch such that:
- the transition-terminal is connected to the output-terminal at an instant in time at which one or more of the non-selected phase-shifted-signals has a non-selected-transition-value; and
- the transition-terminal is disconnected from the output-terminal at an instant in time at which one or more of the non-selected phase-shifted-signals has a non-selected-end-transition-value.

In one or more embodiments, the switching-block further comprises a phase-select-switch configured to selectively provide one of the plurality of phase-shifted-signals to the transition-terminal of the output-switch as the selected phase-shifted-signal. The controller may be configured to control the phase-select-switch such that the selected phase-shifted-signal is provided to the transition-terminal of the output-switch at an instant in time that is in advance of, or coincides with, the selected phase-shifted-signal having a transition-predetermined-value.

In one or more embodiments, the controller is further configured to:
- process: (i) the plurality of phase-shifted-signals; (ii) a current-state-signal that is representative of a current state of the output-signal; and (iii) a transmit-command-signal that is representative of a trigger that a transition in the output-signal is required; and
- provide: (i) a phase-select-control-signal for operating the phase-select-switch; and (ii) an output-switch-control-signal for operating the output-switch.

In one or more embodiments, the phase-shift oscillator comprises three, four or more phase-shifters.

In one or more embodiments, the phase-shift oscillator comprises a switched-capacitor phase-shift oscillator.

In one or more embodiments, one or more of the plurality of phase-shifters comprises an R-C section, wherein one or more of the R-C sections comprise a phase-shift-switched-capacitor and a phase-shift-capacitor.

In one or more embodiments, each of the phase-shifters comprises an R-C section and a gain stage. The plurality of phase-shifters may be connected together in series in a loop.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 3b shows an example simulation implementation of the oscillator of FIG. 3a;

FIG. 4 shows an example implementation of an R-C section that can be used as part of the phase-shift oscillator, such as the oscillators of FIGS. 2 and 3a;

FIG. 8b shows one example circuit implementation of the priority-selection block of FIG. 8a.

In a LIN (Local Interconnect Network) transceiver, a waveform is generated for driving a transmitter. Specifications and requirements with respect to pulse-width, smoothness and a well-defined transition-shape can apply. A raised-cosine shape can be used to provide a transition between a high level and a low level, and vice versa, in the output-signal that is to be transmitted. Such a waveform shape can be good for minimizing/reducing emissions.

Figure 1A:
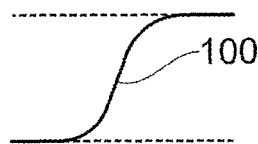
FIGS. 1a and 1b show example waveforms that can be used to drive a LIN output stage.
Figure 1B:
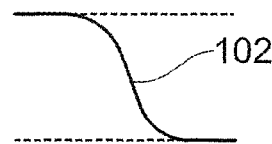

FIGS. 1a and 1b show example waveforms 100, 102 that have a raised-cosine shape, and can be used to drive a LIN output stage. Assuming there is no polarity-inversion in the output stage, a low signal can correspond to the so-called 'dominant' state on the LIN-bus, and a high signal can correspond to the so-called 'recessive' state. FIG. 1a shows a transition from a low signal value to a high signal value, wherein the transition is in the shape of a raised-cosine 100. FIG. 1b shows a transition from a high signal value to a low signal value, and the transition is again in the shape of a raised-cosine 102. The transition in each of the waveforms 100, 102 can be considered as having a minimum-value, a maximum-value, and a middle-value. For a corresponding sinewave representation of the transitions, the middle-value can also be referred to as a zero-value or a zero-crossing.

One or more of the following example embodiments can provide a raised-cosine waveform as a transition in an output signal, such as a LIN transmission signal, in an advantageous way. It will be appreciated that sinewave oscillators can be used to provide raised-cosine waveforms because the shape of a raised-cosine is identical to a sinewave.

Figure 2:
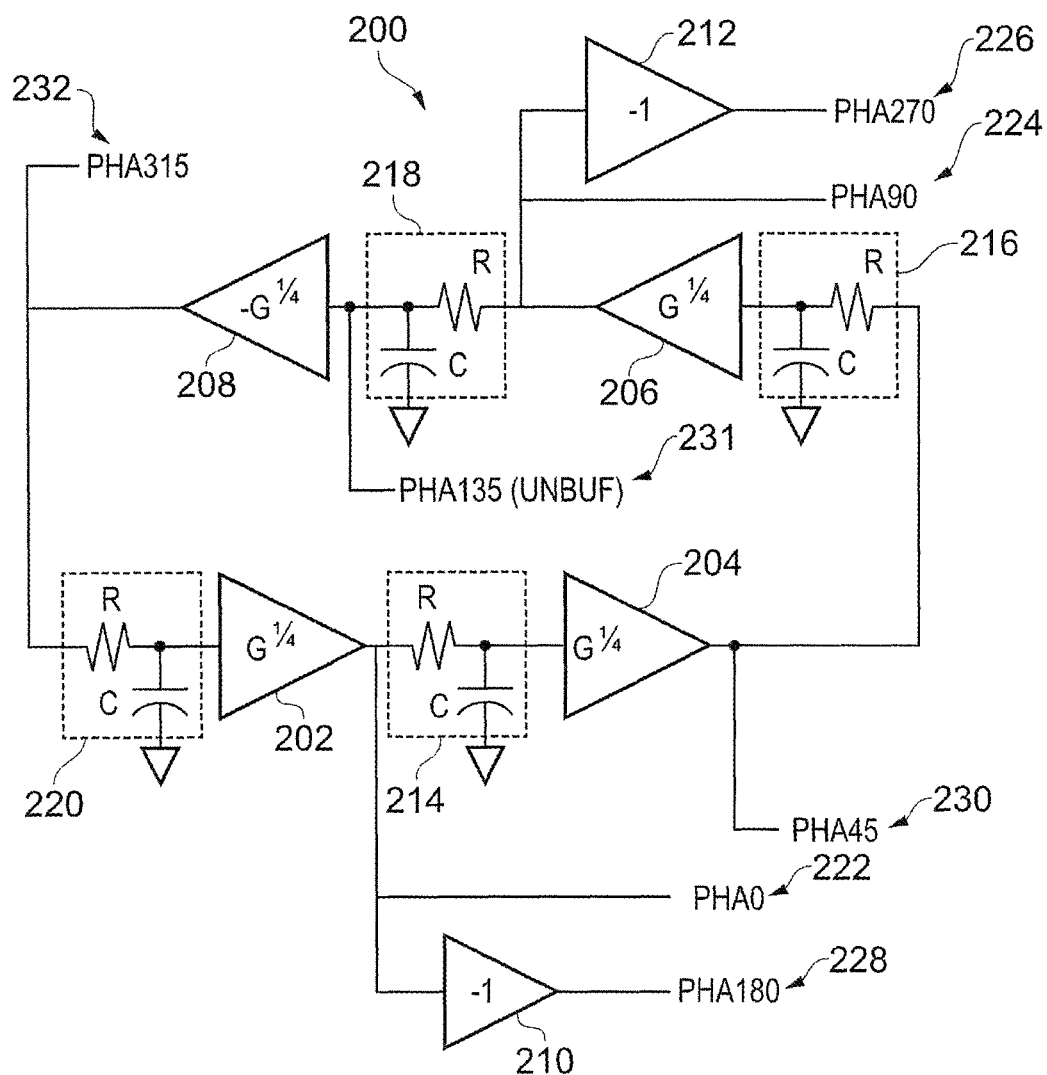
FIG. 2 shows a switched capacitor phase-shift oscillator that can be provided as part of an example embodiment of a transmission system.

FIG. 2 shows a switched capacitor phase-shift oscillator 200 that can be provided as part of an example embodiment of a transmission system. The switched capacitor phase-shift oscillator 200 can provide an inherently 'correct' sinewave.

Various implementations of phase-shift oscillators can be used, with varying amounts of phase shift per stage. FIG. 2 represents a Bubba oscillator, which includes four gain stages 202, 204, 206, 208 in series with each other in a loop. In this example, the gain 'G' is distributed between the gain stages/buffers, as shown in FIG. 2 as $G^{1/4}$ associated with each gain stage 202, 204, 206, 208.

The oscillator 200 of FIG. 2 uses R-C sections 214, 216, 218, 220, one of which is connected in series between each adjacent pair of gain stages 202, 204, 206, 208, for realizing the phase shifts. In this way, a consecutive pair of an R-C section and a gain stage can be considered as a phase-shifter, each configured to provide one of a plurality of phase-shifted-signals.

One of the gain stages 208, applies a negative gain value, such that it provides the functionality of an inverting stage. The output signal of each gain stage 202, 204, 206, 208 provides an oscillator output signal that has the same frequency, and in this example also the same amplitude, but is phase shifted with respect to the other output signals. More particularly:

The output signal of the first gain stage 202 provides a phase-shifted-signal (PHA0) with a 0° phase shift 222;

The output signal of the second gain stage 204 provides a phase-shifted-signal (PHA45) with a 45° phase shift 230 (phase shifted with respect to the zero phase-shift signal (PHA0 222);

The output signal of the third gain stage 206 provides a phase-shifted-signal (PHA90) with a 90° phase shift 224 (phase shifted with respect to the zero phase-shift signal (PHA0 222); and The output signal of the fourth gain stage 208 (which applies a gain $G^{1/4}$ in combination with a polarity inversion) provides a phase-shifted-signal (PHA315) with a 315° phase shift 232. In this case, the polarity inversion has the same effect as a 180° phase shift to what would otherwise be a phase-shifted signal with a 135° phase shift. An (unbuffered) phase-shifted-signal (PHA135) with a 135° phase shift 231 is identified in FIG. 2 as the input signal to the fourth gain stage 208.

In this way, the oscillator 200 of FIG. 2 provides four sinusoidal waveforms with phase shifts of 45 degrees with respect to each other (such as 0, 45, 90, 135 degrees). As shown in FIG. 2, the oscillator 200 can include inverters to provide signal inversion such that the remainder of the phases can be derived (180, 225, 270, 315 degrees). More particularly, one or more of the following inverters can be included:

A first inverter 210, for receiving the output signal from the first gain stage 202, provides a phase-shifted-signal (PHA180) with a 180° phase shift 228;

A second inverter (not shown), for receiving the output signal from the second gain stage 204, can provide a phase-shifted-signal (PHA225) with a 225° phase shift; and A third inverter 212, for receiving the output signal from the third gain stage 206, provides a phase-shifted-signal (PHA270) with a 270° phase shift 226.

In the example of FIG. 2, as indicated above, the functionality of an inverter is incorporated into the fourth gain stage 208, such that it provides a phase-shifted-signal (PHA315) with a 315° phase shift 232 at its output terminal.

In this example, since each of the inverters are connected to the outputs of the gain-stages, all 'derived' PHAn signals (provided as output signals by the inverters) have the same amplitude as the other 'non-derived' PHAn signals (that are provided directly as output signals from the gain-stages).

In other examples, differential circuitry can be used to provide the phase-shifted signals with the remainder of the phases (180, 225, 270, 315 degrees). Such a differential realization of an oscillator that employs differential (/balanced) gain stages can directly result in the availability of all polarity inverted signals, such that inverters are not required to provide the 180 degrees phase-shifted versions of the oscillator signals.

Figure 3A:
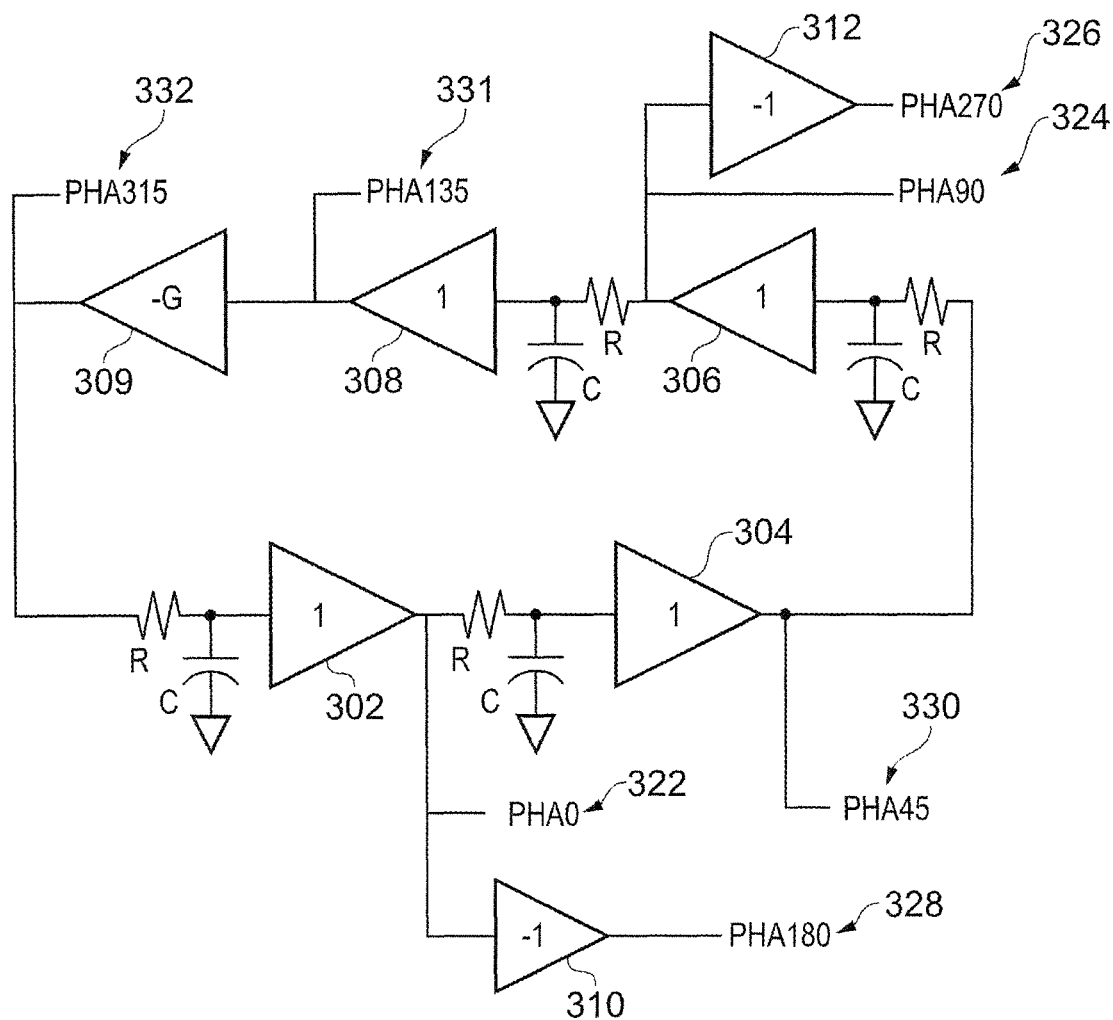
FIG. 3a shows another example of a switched capacitor phase-shift oscillator that can be provided as part of an example embodiment of a transmission system.

FIG. 3a shows another example of a switched capacitor phase-shift oscillator that can be provided as part of an example embodiment of a transmission system. In this example, the oscillator includes four unity-gain non-inverting stages 302, 304, 306, 308, and one polarity-inverting buffer inverting buffer stage 309 with make-up gain (−G). As above, the oscillator of FIG. 3a includes a plurality of phase-shifters, each configured to provide one of a plurality of phase-shifted-signals 322, 330, 324, 331, 328, 326, 332.

Figure 3B:
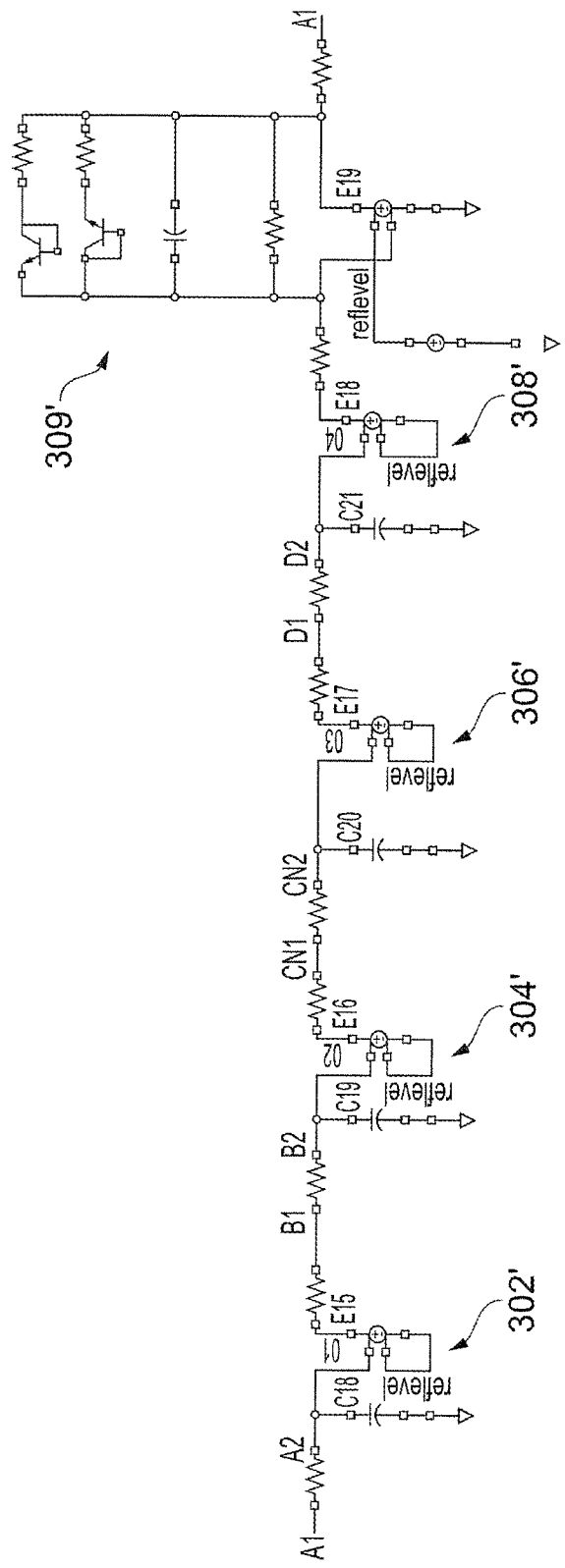

FIG. 3b shows an example simulation implementation of the oscillator of FIG. 3a. The gain stages of FIG. 3b have been given reference numbers that correspond to the gain stages of FIG. 3a.

It will be appreciated that various implementations of phase-shift oscillators can be used with examples disclosed herein, with varying amounts of phase shift per stage. For clarity, the following description will explain operation based on four available phases (0, 90, 180, 270 degrees), appearing in the figures as signals PHA0, PHA90, PHA180 and PHA270. However, it will be appreciated that the resolution of the phase-shifted-signals can be extended, for instance to 45 degrees. As will be appreciated from the below description, this can provide a higher resolution such that the transmission system can more quickly respond to a transmission-command.

As will be discussed below, the transmission system includes additional components for providing a portion of a selected one of the phase-shifted-signals (PHA0, PHA90, PHA180, PHA270) as the rising or falling edge in an output-signal of the transmission system. Advantageously, the system can use one or more of the phase-shifted-signals, which may be selected or the non-selected phase-shifted-signals, to accurately determine the time at which the portion of the selected one of the phase-shifted-signals should be used as the output-signal.

Figure 4:
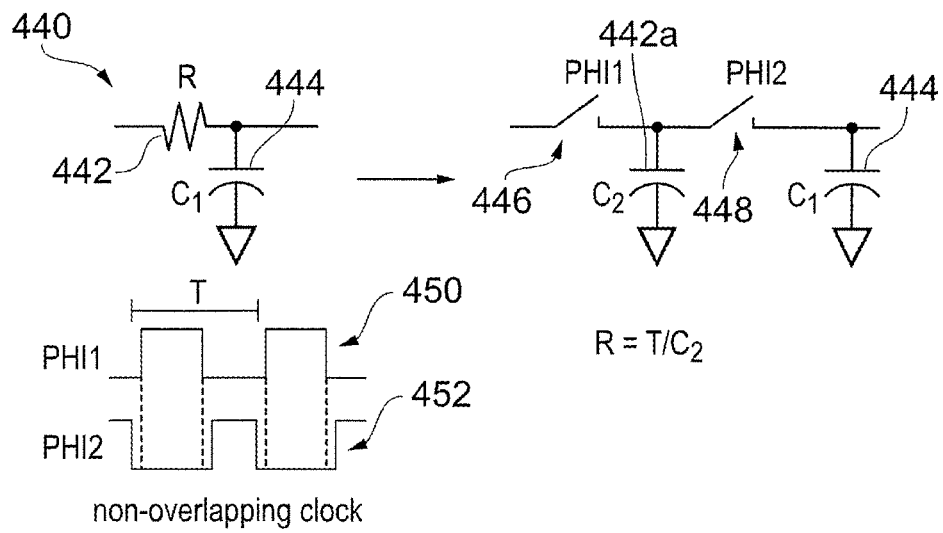

FIG. 4 shows an example implementation of an R-C section 440 that can be used as part of a phase-shift oscillator, such as the oscillators of FIGS. 2 and 3a. The R-C section 440 includes the functionality of a phase-shift-resistor 442 and phase-shift-capacitor 444. The phase-shift-resistor 442 is connected in series between (i) the output terminal of a gain stage, and (ii) the input terminal of the next gain stage in the loop. The phase-shift-capacitor 444 is connected in series between: (i) the input terminal of the next gain stage in the loop, and (ii) a reference terminal, such as ground.

The phase-shift-resistor 442 of each R-C section 440 can be replaced by a phase-shift-switched-capacitor, which is a switched capacitor, as shown on the right-hand side of FIG. 4. The phase-shift-switched-capacitor includes: a first-phase-shift-switch 446, a second-phase-shift-switch 448, and a first-phase-shift-switched-capacitor 442a. The phase-shift-capacitor 444 is also shown on the right-hand side of FIG. 4. The first-phase-shift-switch 446 and the second-phase-shift-switch 448 are connected in series with each other between a switched-capacitor-first-terminal and a switched-capacitor-second-terminal. The first-phase-shift-switched-capacitor 442a is connected in series between: (i) the node between the series connection of the first-phase-shift-switch 446 and the second-phase-shift-switch 448, and (ii) a reference terminal, such as ground. The phase-shift-capacitor 444 is connected in series between: (i) switched-capacitor-second-terminal, and (ii) a reference terminal, such as ground.

The first-phase-shift-switch 446 and the second-phase-shift-switch 448 can be controlled by non-overlapping clock signals (PHI1 & PHI2) 450, 452, as shown in FIG. 4. Logically high states of clock-signal PHIn, as shown in FIG. 4, result in closing of the controlled switch. The clock being non-overlapping prevents simultaneously closing of the first-phase-shift-switch 446 and the second-phase-shift-switch 448.

Assuming identical dimensioning for all phase-shifters/stages, the oscillation-frequency of a phase-shift oscillator is given by $f_{osc}=1/(2\pi RC)$. By replacing the resistors with switched-capacitors, as shown in FIG. 4, the oscillation frequency is proportional to a capacitance ratio $C_1/C_2$. That is, the ratio of the capacitance values of the first-phase-shift-switched-capacitor 442a and the phase-shift-capacitor 444. In this way, the influence of process spread can be reduced or minimised. An available system clock can be used, such that the clocking frequency $f_{osc}$ of the switched-capacitor is: $f_{osc}=1/(2\pi T(C_1/C_2))$, where T is the period of the system clock, as shown in FIG. 4.

Optionally, a variable transition time can easily be provided by changing the clocking frequency (1/T) of a switched-capacitor phase-shift oscillator. All delays and frequencies can therefore be advantageously scaled accordingly without further adaptations to the circuit/system.

Figure 5:
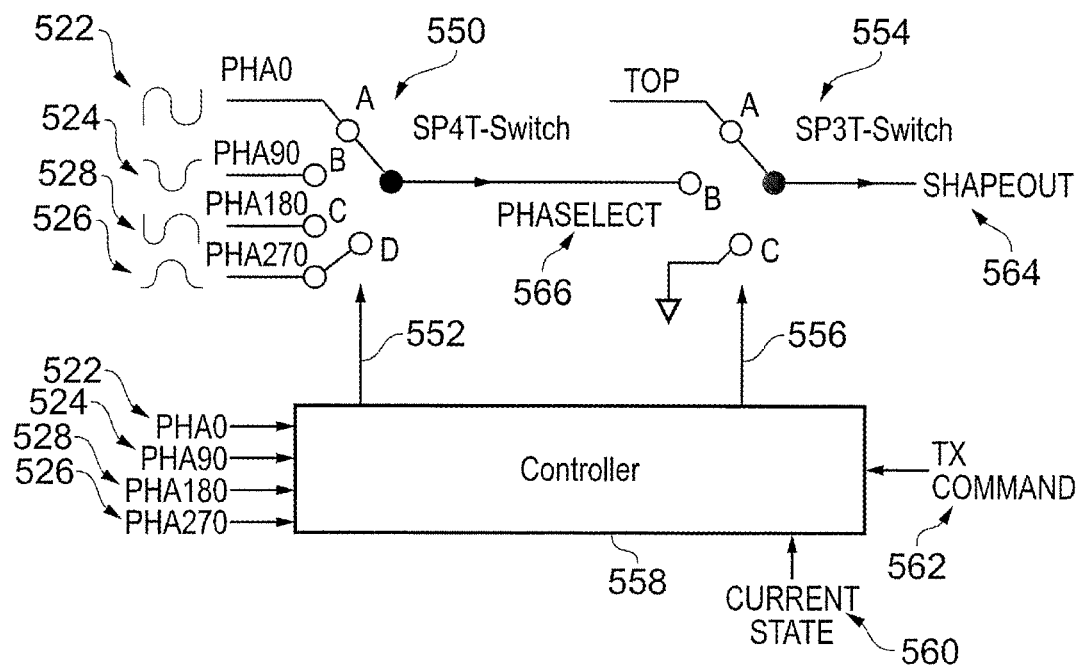
FIG. 5 shows components that can be provided as part of an example embodiment of a transmission system.

FIG. 5 shows components that can be provided as part of an example embodiment of a transmission system. FIG. 5 shows a switching-block that includes a phase-select-switch 550 and an output-switch 554. FIG. 5 also shows a controller 558 for: providing a phase-select-control-signal 552 for operating the phase-select-switch 550; and an output-switch-control-signal 556 for operating the output-switch 554.

The output-switch 554 can selectively connect one of: (i) a high-terminal (A), (ii) a transition-terminal (B); and (iii) a low-terminal (C) to an output-terminal, in order to provide the output-signal (SHAPEOUT) 564 of the transmission system. The high-terminal (A) receives a high-signal (TOP). The transition-terminal (B) receives a selected phase-shifted-signal (PHASELECT) 566, corresponds to the most relevant oscillator-phase output signal (phase-shifted-signal) as will be described in more detail below. The low-terminal (C) receives a low-signal. In this example the output-switch is a SP3T (Single Pole, 3 Throw)-switch. The output-terminal/output-pole of the output-switch 554 can be connected to an input-terminal of a LIN-transmitter, which can be an output stage to drive the actual LIN bus.

As will be discussed in more detail below, specifically with reference to FIG. 9, the controller 558 can control the output-switch 554 such that: the transition-terminal (B) is connected to the output-terminal at an instant in time based on one or more of the other (non-selected) phase-shifted-signals, and the transition-terminal (B) is disconnected from the output-terminal at an instant in time based on one or more of the non-selected phase-shifted-signals. In this way, other phase-shifted-signals, that is, not the selected one for providing as a portion of the output-signal (SHAPEOUT) 564, are used to set the timing at which the selected phase-shifted-signal is used to define a transition in the output-signal (SHAPEOUT) 564. This can enable accurate timing information to be provided. A concept of this functionality is therefore to use relevant properties of the non-selected signals to assist in the control of the output-switch 554, since the set of phase shifted signals are accurately related to each other.

In another example, the controller 558 can provide the selected one of the phase-shifted-signals to the output-signal as a transition in the output-signal, at an instant in time that is based on the selected one of the phase-shifted-signals, for example when the selected one of the phase-shifted-signals reaches a maximum- or minimum-value. Optionally, the controller 558 can also use one or more of the plurality of phase-shifted-signals that are not selected.

It will be appreciated that the functionality of the phase-select-switch 550 and the output-switch 554 can be provided by any suitable components/logic, for instance, the functionality of the two switches can be merged into a single switch.

Figure 6:
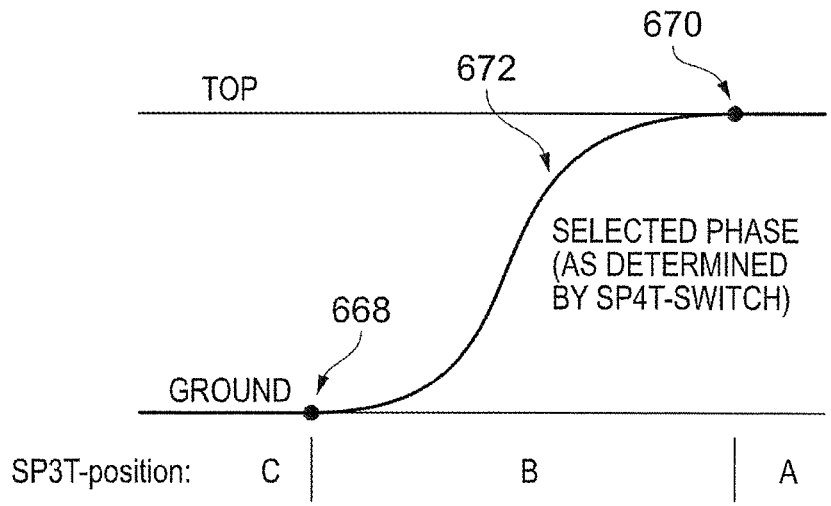
FIG. 6 shows an example of an output-signal, and how the level of the output-signal corresponds to the position of the output-switch that is shown in FIG. 5.

FIG. 6 shows an example of an output-signal, and how the level of the output-signal corresponds to the position of the output-switch that is shown in FIG. 5. In a first period of time, the output signal has a low-signal level, which in this example is a ground level. During this period of time, the output-switch connects the low-terminal (C) to its output terminal, as shown by the "SP3T-position" at the bottom of FIG. 6.

At a first instant in time shown with reference 668 in FIG. 6, the output-switch is operated by the controller such that it connects the transition-terminal (B) to its output terminal. At a second instant in time shown with reference 670, the output-switch is operated by the controller such that it connects the high-terminal (A) to its output terminal. After the second instant in time 670, the output signal has a high-signal level, which in FIG. 6 is referred to as TOP. In this way, the pulse is started from a low level, then a rising transition is made (starting when the most appropriate oscillator-phase reaches its minimum-value, from which point in time it can serve as the desired signal transition for the output waveform) and finally the high level is reached (when the same selected oscillator-phase has reached its maximum-value).

By properly controlling the timing of the changing of the output-switch from the low-terminal (C) to the transition-terminal (B), and from the transition-terminal (B) to the high-terminal (A), and also properly controlling the phase-select-switch, a substantially continuous output-signal can be provided with a raised-cosine transition 672 from the low-signal level to the high-signal level. It will be appreciated that similar operations can be performed in reverse to transition from the high-signal level to the low-signal level.

Returning to FIG. 5, the phase-select-switch 550 selectively provides one of a plurality of phase-shifted-signals to the transition-terminal (B) of the output-switch as the selected phase-shifted-signal (PHASELECT) 566. In this example, the phase-select-switch 550 can selectively provide one of the following phase-shifted-signals:

a phase-shifted-signal (PHA0) with a 0° phase shift 522;
a phase-shifted-signal (PHA90) with a 90° phase shift 524;
a phase-shifted-signal (PHA180) with a 180° phase shift 528; and
a phase-shifted-signal (PHA270) with a 270° phase shift 526.

As will be discussed in more detail below, specifically with reference to FIG. 8a, the controller 558 can control the phase-select-switch 550 such that it selectively provides one of the phase-shifted-signals 522, 524, 528, 526 as the selected phase-shifted-signal (PHASELECT) 566 at an instant in time that is in advance of, or coincides with, the selected phase-shifted-signal (PHASELECT) 566 having a transition-predetermined-value. In the following examples, the transition-predetermined-value is a peak-value such as minimum- or maximum-value. As discussed herein, especially with reference to FIG. 6, the output-switch 554 will use the selected phase-shifted-signal (PHASELECT) 566 to provide a transition in the output-signal (SHAPEOUT) 564. Therefore, the selected phase-shifted-signal (PHASELECT) 566 should be made available at, or in advance of, a minimum-value for a rising transition in the output-signal 564, and should be made available for the duration of the transition. Similarly, for a falling transition, it should be made available at, or in advance of, a maximum-value.

In this way, the phase-select-switch 550 can provide an appropriate selected phase-shifted-signal (PHASELECT) 566; appropriate in terms of being the next phase-shifted-signal that is suitable for a transition from an existing level of the output-signal (either high or low).

The controller receives a plurality of phase-shifted-signals as input signals, which in this example are the same phase-shifted-signals that are provided to the phase-select-switch 550: PHA0 522; PHA90 524; PHA180 528; and PHA270 526. The controller also receives a current-state-signal 560 as an input signal. The current-state-signal 560 is representative of a current state of the output-signal (SHAPEOUT) 564—that it is, it is representative of either a low-value or a high-value of the data that is actually being transmitted for the application. The controller 558 can use the current-state-signal 560 to determine if a next transition in the output-signal (SHAPEOUT) 564 will be from high-to-low or from low-to-high. If the output-signal (SHAPEOUT) 564 currently has a high-value, then the next transition must be from high-to-low. If the output-signal (SHAPEOUT) 564 currently has a low-value, then the next transition must be from low-to-high.

The controller 558 also receives a transmit-command-signal 562, which is representative of a trigger that a transition in the output-signal (SHAPEOUT) 564 is required. As will be discussed below with reference to FIG. 9, the controller uses the transmit-command-signal 562 to determine that the state of the output-switch 554 should be changed, and that the output of the phase-select-switch 550 should be fixed for the duration of the transition. It will be appreciated that the transition will inherently be a raised-cosine, since it's derived from a phase-shifted-signal from a sinusoidal oscillator, and therefore has the same wave shape.

The switching block of FIG. 5 can be summarised as having an output-switch 554 that is controlled so as to provide the output-signal (SHAPEOUT) 564 with the required wave shape by connecting an appropriate signal to the output-terminal, and having a phase-select-switch 550 which in this example continuously selects an appropriate phase-shifted-signal so that it is available to the output-switch 564 if a transmit-command-signal 562 is received that calls for a transition in the output-signal (SHAPEOUT) 564.

In some examples, filtering/smoothing of the output-signal (SHAPEOUT) 564 can be applied to help provide smooth fluent signal transitions. However, the requirements of this filtering can be far less than the more critical filtering of a transmission system that utilises DAC-steps for implementing a transition in the output-signal.

Also, in examples where balancing is (at least partly) employed in the system, for instance in relation to middle-crossing detectors/zero-crossing detectors, the benefits of balancing can be further exploited. The phase-shift oscillator itself for instance could be made differential as well, leading to further benefits of, for example: (i) an increased current draw from a voltage supply at a signal transition can be first-order cancelled by a decreased current draw by the opposite polarity signal-component, which can result in a reduced supply current ripple; and (ii) for a given supply voltage, the actual signal can be double in amplitude (since the actual signal consists of the difference between its two polarities), which can be beneficial for the signal to noise ratio.

Figure 7A:
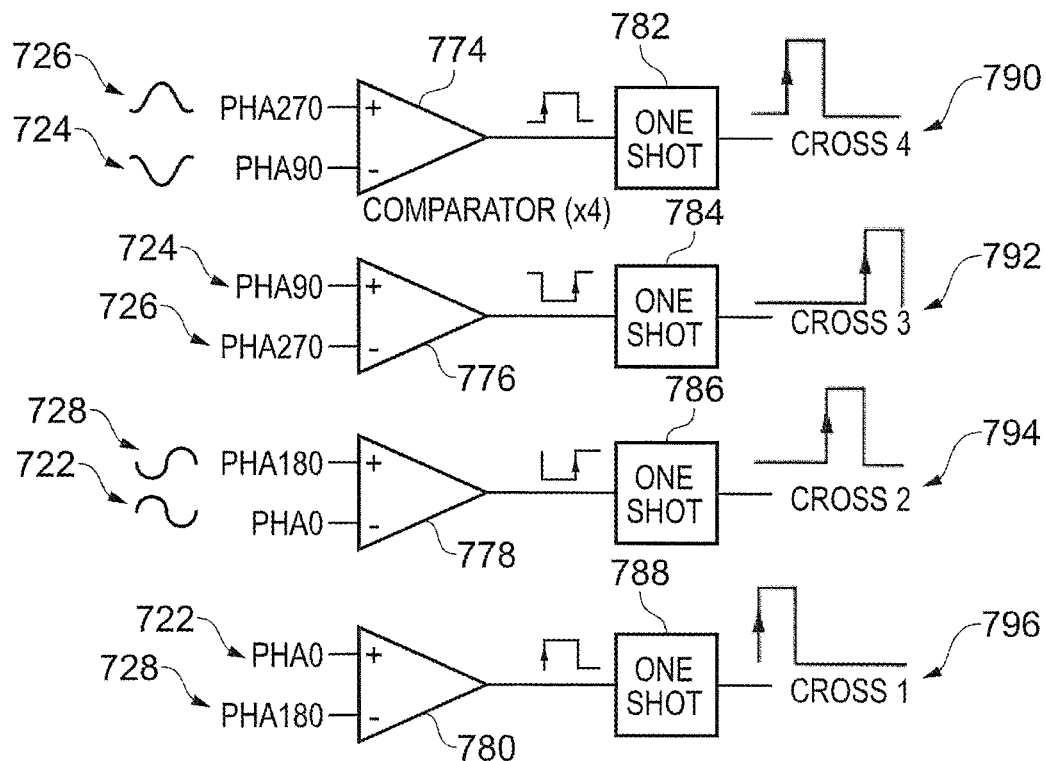
FIG. 7a illustrates part of the functionality of the controller of FIG. 5.

FIG. 7a illustrates part of the functionality of the controller of FIG. 5. FIG. 7a shows how the plurality of phase-shifted-signals PHA0 722; PHA90 724; PHA180 728; and PHA270 726 are processed in order to determine a plurality of phase-peak-signals 790, 792, 794, 796, each one representative of an instant in time at which one of the plurality of phase-shifted-signals PHA0 722; PHA90 724; PHA180 728 is at a maximum- or minimum-level. More particularly, the plurality of phase-peak-signals 790, 792, 794, 796 in this example are:

CROSS4 790, which is representative of an instant in time at which: PHA0 722 has a maximum-level; and PHA180 728 has a minimum-value;

CROSS3 792, which is representative of an instant in time at which: PHA0 722 has a minimum-level; and PHA180 728 has a maximum-value;

CROSS2 794, which is representative of an instant in time at which: PHA270 726 has a maximum-level; and PHA90 724 has a minimum-value;

CROSS1 796, which is representative of an instant in time at which: PHA270 726 has a minimum-level; and PHA90 724 has a maximum-value.

As will be discussed below, the plurality of phase-peak-signals 790, 792, 794, 796 will be used to generate the phase-select-control-signal for operating the phase-select-switch; and the output-switch-control-signal for operating the output-switch.

As shown in FIG. 7a, in order to identify a maximum- or minimum-value in any given one of the phase-shifted-signals, the two adjacent phase-shifted-signals (one with a phase shift that is 90° higher, and one with a phase shift that is 90° lower) are processed in order to determine the phase-peak-signals 790, 792, 794, 796. In this example, the two adjacent phase-shifted-signals are provided as input signals to a comparator 774, 776, 778, 780. The output terminal of each of the comparators 774, 776, 778, 780 is connected to an optional one-shot block 782, 784, 786, 788, which provides the phase-peak-signals 790, 792, 794, 796 as a pulse of a predetermined length in response to a rising edge in the output signal from the associated comparator 774, 776, 778, 780.

Figure 7B:
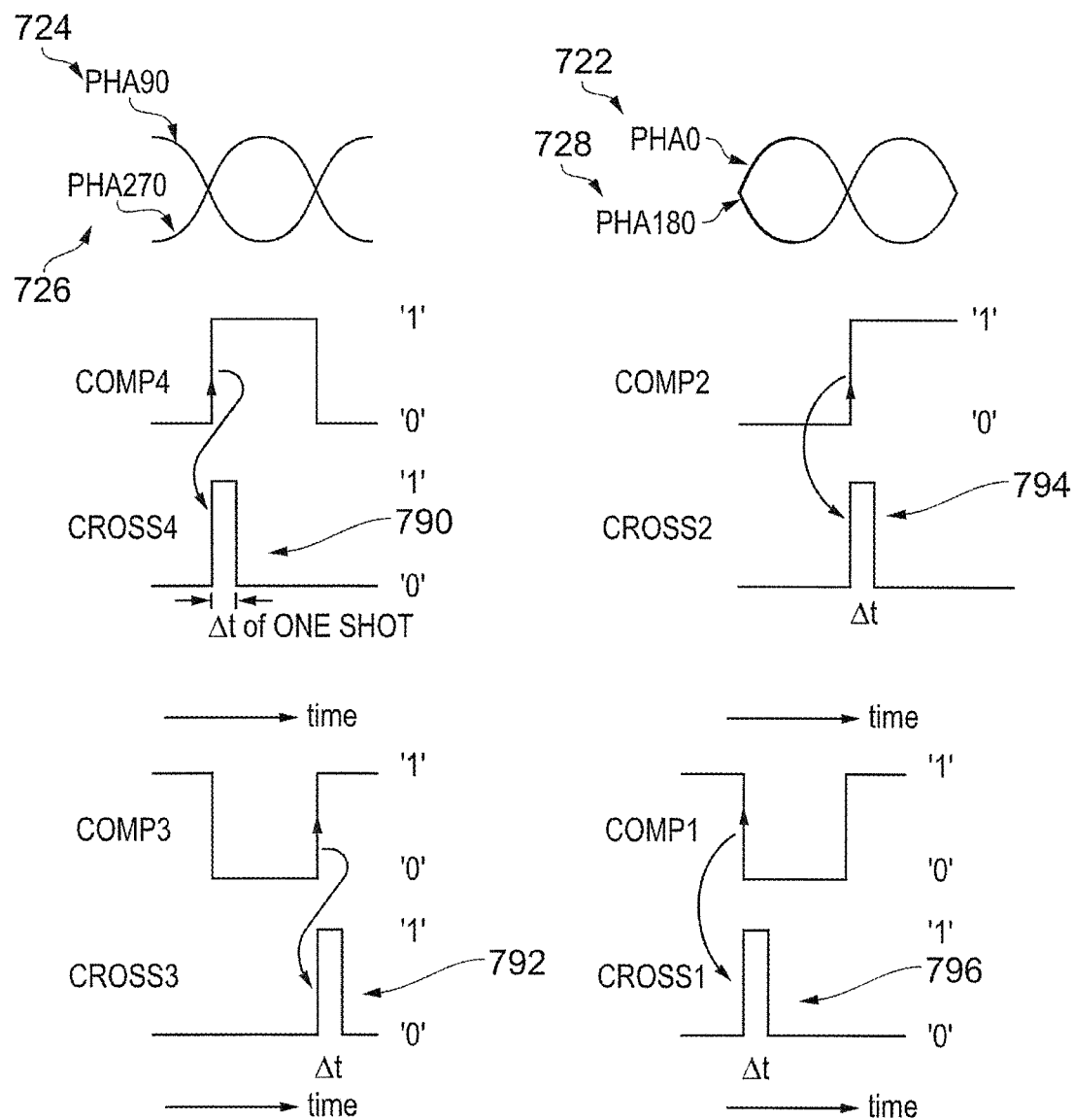
FIG. 7b shows graphically the phase-shifted-signals, and their relationship over time with the phase-peak-signals.

FIG. 7b shows graphically the phase-shifted-signals PHA0 722; PHA90 724; PHA180 728; PHA270 726, and their relationship over time with the phase-peak-signals 790, 792, 794, 796.

Due to the accurate phase relationships of the phase-shifted-signals (PHA0 722; PHA90 724; PHA180 728, PHA270 726), the minimum- or maximum-value of a certain phase-shifted-signal will simultaneously occur with the middle-values of its two most direct neighbouring-phases (one 90° before, one 90° after). Of these two neighbouring phases, one will be a positive-going middle-crossing, and the other a negative-going middle-crossing. These middle-crossings are examples of a non-selected-transition-value. That is, the non-selected-transition-value may be a middle-value (which can be considered as a zero-value for the corresponding sinewave). The components of FIG. 7a can thus provide the phase-peak-signals 790, 792, 794, 796, such that they are representative of an instant in time at which one of the phase-shifted-signals is at a maximum- or minimum-value, with inherently accurate timing information.

In other examples, the non-selected-transition-value may not be a middle-value. That is, in examples where the phase difference between adjacent phase-shifted-signals is less than 90° (that is, a greater phase-shift resolution), non-selected phase-shift-signals that are not necessarily 90° out of phase with the selected phase-shift-signal can be used to determine the instant in time that the selected one of the phase-shifted-signals is provided as a transition in the output-signal. For instance, if steps of 45° between phase-shift-signals are available, then appropriate ones of the non-selected phase-shift-signals can be used to advantageously reduce the timing delay between receipt of a transmit-command-signal, and the start of the transition in the output-signal.

The example of FIG. 7a therefore employs differential middle-crossing detectors (operating on the nth−1 & nth+1 phases), which can improve the reliability of the phase-peak-signals 790, 792, 794, 796. In this way, the transmission system can be made even more failsafe. FIG. 7a can represent a process-insensitive and far more robust method than alternatives for identifying maximum- and minimum-values, such as peak-detection.

More generally the transmission system can selectively provide one of the plurality of phase-shifted-signals (PHA0 722; PHA90 724; PHA180 728, PHA270 726) as the selected phase-shifted-signal at an instant in time that is in advance of, or coincides with, one or two of the non-selected phase-shifted-signals having a non-selected-transition-value (such as a middle-value). The two non-selected phase-shifted-signals are 90° out of phase with the selected phase-shifted-signal in some examples. In the example of FIG. 7a, the comparators 774, 776, 778, 780 can compare two of the phase-shifted-signals (that will be non-selected phase-shifted-signals) with each other to determine the instant in time that is in advance of, or coincides with, the two phase-shifted-signals having a middle-value.

Figure 8A:
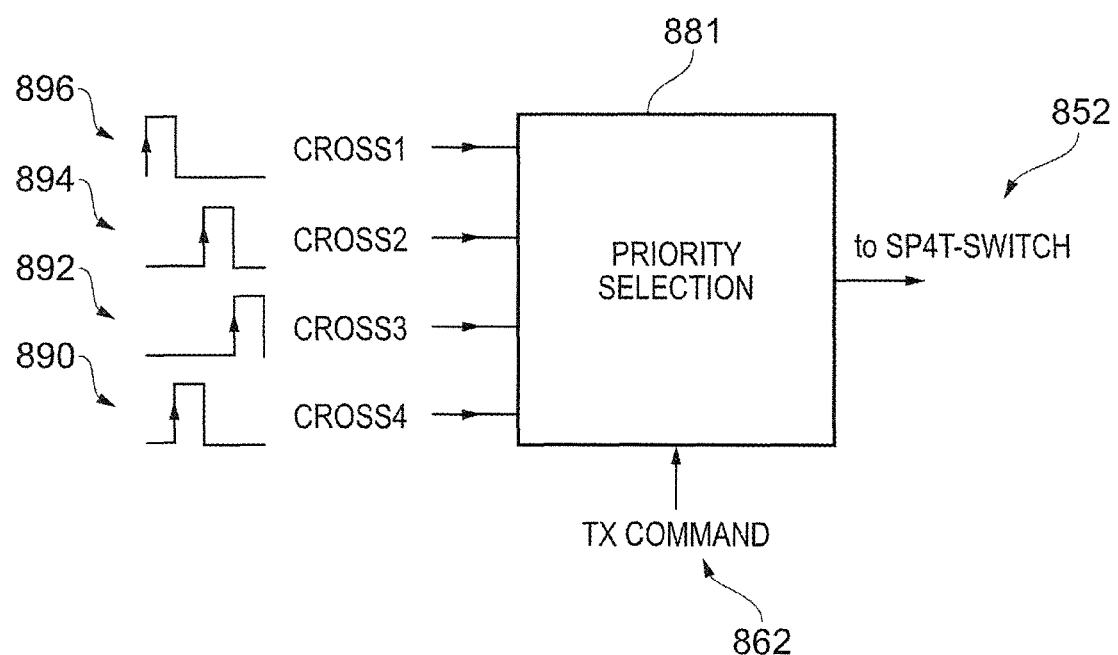
FIG. 8a shows a priority-selection block, which can be part of the controller of FIG. 5.

FIG. 8a shows a priority-selection block 881, which can be part of the controller of FIG. 5. The priority-selection block 881 receives: the phase-peak-signals (CROSS4 890, CROSS3 892, CROSS2 894, CROSS1 896); and the transmit-command-signal 862 as input signals. The priority-selection block 881 provides the phase-select-control-signal 852 for operating the phase-select-switch.

The priority-selection block 881 can continuously provide the phase-select-control-signal 852 such that the phase-select-switch selects the most suited phase-shifted-signal PHA0, PHA90, PHA180, PHA270, and makes that phase-shifted-signal available for selection by the output-switch as the PHASELECT signal. To be prepared for a signal transition in the output-signal, the phase-select-control-signal 852 can control the phase-select-switch of FIG. 5 such that it cycles from position to 'C', to 'B', to 'A', again to 'D' and so on.

In this way, the priority-selection block 881 can enable a minimum-value of one of the phase-shifted-signals to be available as the most suited transition as soon as possible after the transmit-command-signal is received. That is, the next one of the phase-shifted-signals that has a minimum value after the transmit-command-signal is received, will be provided at the output of the phase-select-switch, due to the value of the phase-select-control-signal 852, so that it can be used as a transition in the output-signal. It will be appreciated that, similarly, a maximum-value of one of the phase-shifted-signals can be made available for a falling transition.

When the priority-selection block 881 receives a phase-peak-signal (CROSS4 890, CROSS3 892, CROSS2 894, CROSS1 896) that is representative of a new peak (such as a rising edge in one of the phase-peak-signals) then the priority-selection block 881 changes the state of the phaseselect-control-signal 852. For instance, using the sequence of signals as shown in FIG. 8a: the rising edge of CROSS1 896 causes the priority-selection block 881 to make the phase-select-switch assume a certain position; then, when a next signal transition in a phase-peak-signal arrives later in time (here CROSS4 890), the priority-selection block 881 causes the phase-select-switch phase-select-control-signal 852 to operate the phase-select-switch to move to the next position, and so on. For the described system, the sequence is CROSS1, followed in time by CROSS4, CROSS2 and then CROSS3, after which CROSS1 appears again, etc.

By way of example, when a current state of the output-signal is a logic low level, a middle-crossing is detected in the PHA0 and PHA180 signals when the PHA90 signal is at its minimum value, such that the CROSS2 894 signal has a rising edge (as particularly shown in FIG. 7b). In response to the rising edge of the received CROSS2 signal 894, the priority-selection block 881 sets the phase-select-control-signal 852 such that the phase-select-switch provides the PHA90 signal as the PHASELECT signal so that it is immediately ready for use as a transition in the output-signal, if a transmit-command-signal is received that is representative of a TX-command (as will be discussed below).

If a transmit-command-signal 862 is received that is representative of a TX-command, arbitrarily at 60 degrees into the cycle, the priority-selection block 881 awaits the next middle-crossing detection. For the "60° example", this is when the PHA270 and PHA90 signals cross each other, which coincides with the minimum-value of the PHA180 signal. This middle-crossing results in a rising edge of the CROSS4 signal, which causes the priority-selection block 881 to provide the phase-select-control-signal 852 to operate the phase-select-switch to move to the next position (here position C). Also at the same time, as will be discussed below, the controller provides the output-switch-control-signal to the output-switch, to cause it to change to position B, to start a transition in the output-signal.

In this example, following receipt of the transmit-command-signal 862 and the immediately following change of the phase-select-control-signal 852, the priority-selection block 881 inhibits any changes to the phase-select-control-signal 852 for at least the next one middle-crossing detection. This can ensure that the phase-select-switch is not operated midway through the transition in the output-signal, which for this implementation would otherwise interrupt the transition in the output-signal. It will be appreciated that the duration of any such inhibition to changing the phase-select-control-signal 852 can depend upon the resolution of the phase-shifted-signals. It will also be appreciated that other implementations could be used in which any such interruption to the output-signal can be avoided—for example by a modified phase-select-switch having a plurality of output terminals.

Figure 8B:
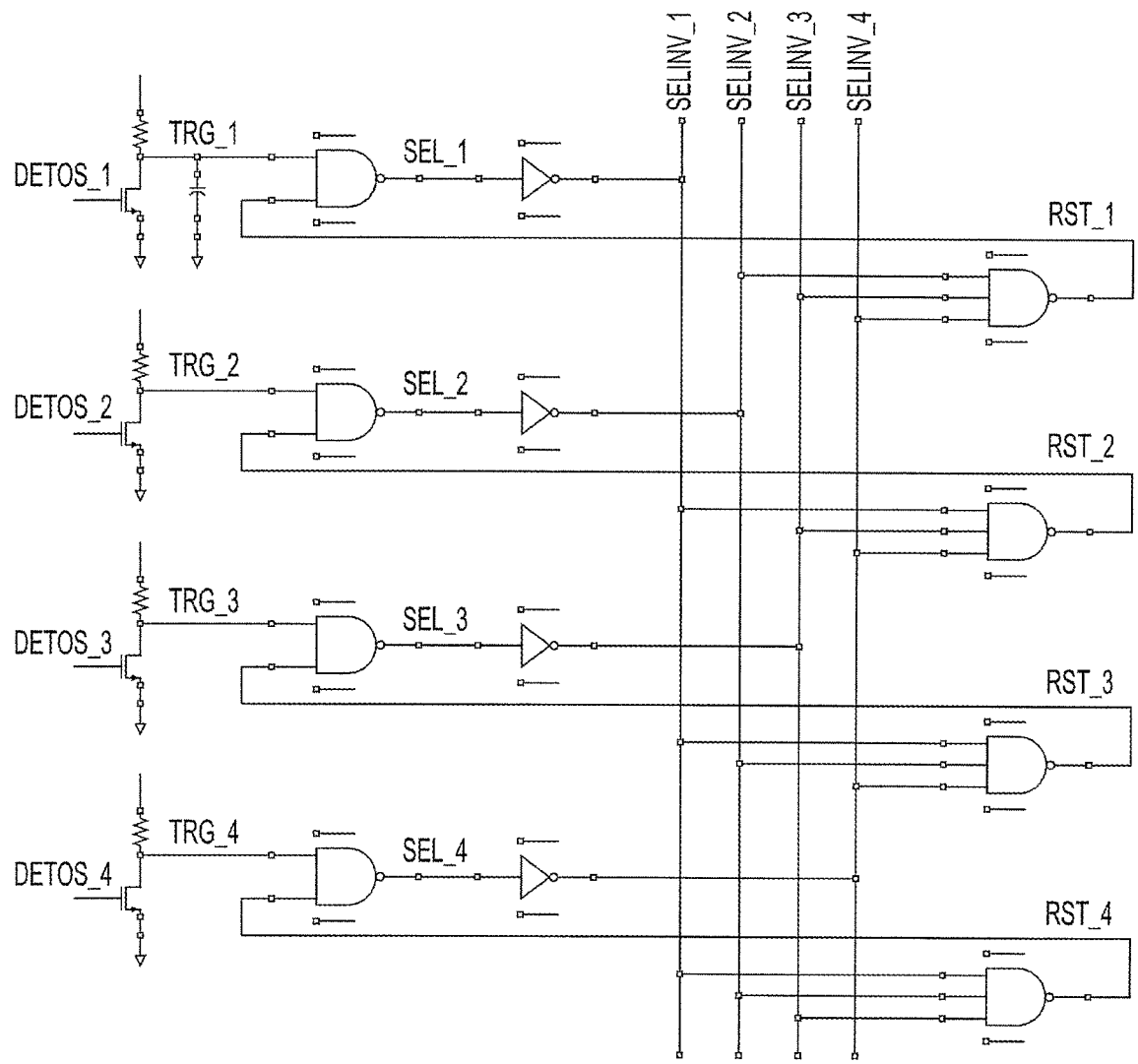

FIG. 8b shows one example circuit implementation of the priority-selection block of FIG. 8a.

Figure 9:
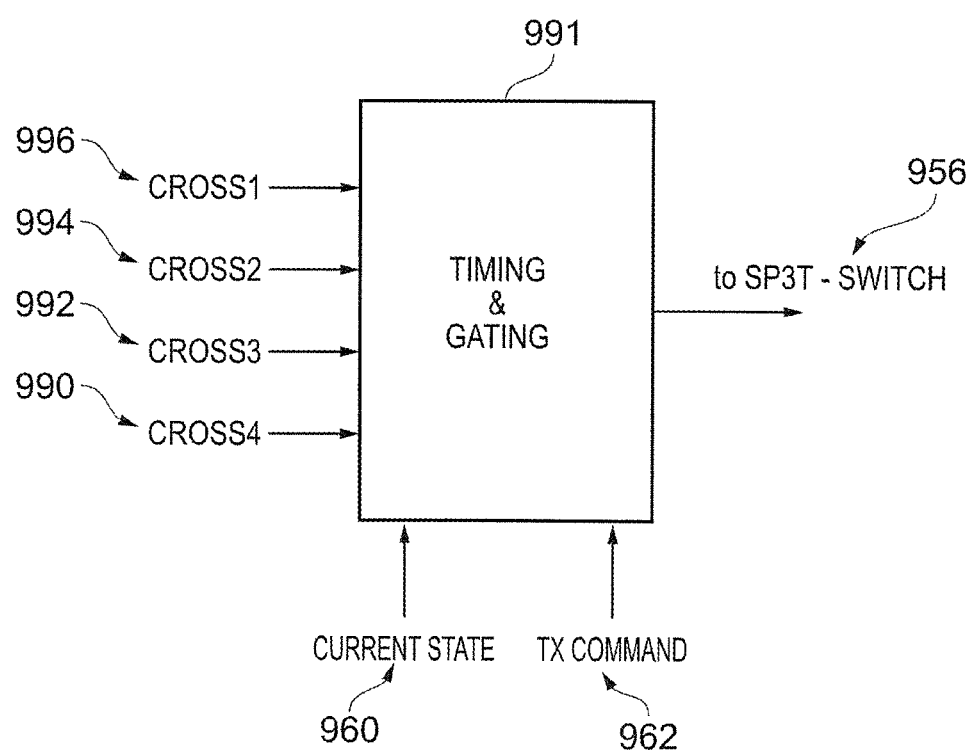
FIG. 9 shows an example of a timing-block 991, which can be part of the controller of FIG. 5

FIG. 9 shows an example of a timing-block 991, which may also be referred to as a timing and gating block, and can be part of the controller of FIG. 5. The timing-block 991 receives the phase-peak-signals (CROSS4 990, CROSS3 992, CROSS2 994, CROSS1 996), the current-state-signal 960, and the transmit-command-signal 962 as input signals. The timing-block 991 provides the output-switch-control-signal 956 for operating the output-switch.

In the case of a rising transition in the output-signal: in response to receiving the transmit-command-signal 962 that is representative of a TX-command, and then subsequently in response to one of the phase-peak-signals (CROSS4 990, CROSS3 992, CROSS2 994, CROSS1 996) being representative of a minimum-value, the timing-block 991 sets the output-switch-control-signal 956 such that the transition-terminal (B) of the output-switch is connected to the output terminal of the output-switch. (The phase-peak-signal that causes the change in the output-switch-control-signal 956 may be referred to as a trigger-phase-peak-signal.) Thus, a transition in the output-signal is underway. Then, when the phase-peak-signal (CROSS4 990, CROSS3 992, CROSS2 994, CROSS1 996) that is 180° later than the trigger-phase-peak-signal is received, which is indicative of the selected phase-shifted-signal having a maximum-value, the timing-block 991 sets the output-switch-control-signal 956 such that the high-terminal (A) of the output-switch is connected to the output terminal of the output-switch. Thus, the transition is complete and the output-signal is set at the high-level.

In this way, once a phase-peak-signal 996, 994, 992, 990 from one of the relevant middle-crossing circuits shown in FIG. 7a occurs (within a valid window in time that the selected phase-shifted-signal is the 'best candidate' for the transition), the timing-block 991 controls the output-switch such that it changes position from the low-level (in case of a previously issued TX-start command) to the pre-selected phase, which is then at its minimum, and so suited for use. The time that the selected phase is at its minimum value is identified from a middle-crossing of a neighbouring-phase that is 90° out of phase with the pre-selected phase. Thus, the transition starts.

It will be appreciated that the timing-block 991 can perform similar functionality for a falling transition in the output-signal, based on the state of the current-state-signal 960.

Therefore, the timing-block 991 can provide the output-switch-control-signal 956 such that it controls the output-switch to: (i) connect the transition-terminal (B) to the output-terminal at an instant in time based on one or more of the other (non-selected) phase-shifted-signals having a non-selected-transition-value (such as a middle-value), and (ii) disconnect the transition-terminal (B) from the output-terminal at an instant in time based on one or more of the other (non-selected) phase-shifted-signals having a non-selected-end-transition-value (such as a middle-value).

In this way, a smooth transition can be made by accurately selecting when to switch from a static level (either low or high level) to a transition edge. Advantageously, accurate timing information can be provided by taking advantage of the other (non-selected) phase-shifted-signals.

It will be appreciated that a waiting time may be involved between the issuing of the TX-command via the transmit-command-signal 962, and the actual start of the signal transition. However, examples described herein can be provided such that the maximum waiting time is at an acceptable level.

As an illustration, a required value for the slope duration is 20 us, and the maximum allowed activation delay is 10 us. Since a transition consists of 50% of the total period of the sinewave—either from minimum to maximum (so from 270 degrees 'into the sinewave' to 90 degrees 'into the next sinewave cycle'), or from maximum to minimum (so from 90 degrees 'into the sinewave' to 270 degrees of the same cycle)—the oscillation period should be 40 us. A system with 4 available signal phases, spaced 90 degrees apart, provides an equally spaced number of 4 maximums and 4 minimums. Therefore, the maximum waiting time is 10 us, which is in direct agreement with the maximum allowed activation delay indicated above.

It will be appreciated that advantageously the number of phase shift stages can be increased, or alternatively one or more inverters can be added to a gain stage setup, such as a Bubba oscillator (as discussed above), such that the activation time can be made shorter if required. Therefore, for the above numerical advantage, halving to 5 us can be straightforward. More generally, any number of phase-shifted-signals can be used, that include sets of relative phase shifts that are 90° phase shifted with respect to at least one other phase-shifted-signal.

One or more of the examples disclosed herein can be considered advantageous when compared with systems that use a digital-to-analogue converter (DAC). Such systems can be based on a resistor string with taps, such that the wave-shape is fixed and defined by the resistor values. Critical post-filtering may be required for such systems to smooth the steps (minimizing emission from the step-wise implementation) while maintaining accurate pulse duty cycles. A compromise thus needs to be made here. Also, such DAC-based systems can be subject to process spread and/or can require significant compensation and calibration. One or more of the examples disclosed herein can be considered as a mixed-mode wave shaper that can provide advantages in terms of an inherently correct waveform, and insensitivity to process spread.

The instructions and/or flowchart steps in the above figures can be executed. In any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services.

As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A transmission system comprising:
an output-terminal configured to provide an output-signal;
a phase-shift oscillator comprising a plurality of phase-shifters, each phase-shifter of the plurality of phase-shifters configured to provide a respective phase-shifted signal of a plurality of phase-shifted-signals; and
a controller configured to:
provide a selected one of the plurality of phase-shifted-signals to the output-signal as a transition in the output-signal, at a first instant in time that is based on one or more of the plurality of phase-shifted-signals, and
selectively provide one of the plurality of phase-shifted-signals as the selected phase-shifted-signal at a second instant in time that coincides with two of the non-selected phase-shifted-signals having a middle-value, wherein the two non-selected phase-shifted-signals are 90° out of phase with the selected phase-shifted-signal.

2. The transmission system of claim 1, wherein the controller is further configured to provide the selected one of the phase-shifted-signals to the output-signal as the transition in the output-signal, at the first instant in time that is based on one or more of the plurality of phase-shifted-signals that are not selected.

3. The transmission system of claim 1, wherein the plurality of phase shifted-signals comprise raised-cosine waveforms.

4. The transmission system of claim 1, wherein the controller is further configured to selectively provide one of the plurality of phase-shifted-signals as the selected phase-shifted-signal at the second instant in time that coincides with the selected phase-shifted-signal having a transition-predetermined-value.

5. The transmission system of claim 4, wherein the transition-predetermined-value comprises a peak-value.

6. The transmission system of claim 1, wherein the controller is further configured to selectively provide one of the plurality of phase-shifted-signals as the selected phase-shifted-signal at an instant in time that coincides with one of the non-selected phase-shifted-signals having a non-selected-transition-value.

7. The transmission system of claim 6, wherein the non-selected phase-shifted-signal is 90° out of phase with the selected phase-shifted-signal, and the non-selected-transition-value is a middle-value.

8. The transmission system of claim 1, further comprising:
a comparator configured to compare the two non-selected phase-shifted-signals with each other to determine the second instant in time that coincides with the two non-selected phase-shifted-signals having the middle-value.

9. The transmission system of claim 1, wherein the phase-shift oscillator comprises three, four or more phase-shifters.

10. The transmission system of claim 1, wherein the phase-shift oscillator further comprises:
a switched-capacitor phase-shift oscillator.

11. The transmission system of claim 10, wherein one or more of the plurality of phase-shifters comprises an R-C section comprising a phase-shift-switched-capacitor and a phase-shift-capacitor.

12. A transmission system comprising:
an output-terminal configured to provide an output-signal;
a phase-shift oscillator comprising a plurality of phase-shifters, each phase shifter of the plurality of phase-shifters configured to provide a respective phase-shifted signal of a plurality of phase-shifted-signals; and
a controller configured to provide a selected phase-shifted-signal from the plurality of phase-shifted-signals to the output-signal as a transition in the output-signal, at an instant in time that is based on one or more of the plurality of phase-shifted-signals; and
a switching-block comprising:
an output-switch configured to selectively connect one of: a high-terminal, a transition-terminal; and a low-terminal to the output-terminal, wherein the high-terminal is configured to a receive a high-signal, the transition-terminal is configured to receive the selected phase-shifted-signal, and the low-terminal is configured to a receive a low-signal; and the controller is configured to control the output-switch such that:
the transition-terminal is connected to the output-terminal at a first instant in time at which one or more of the non-selected phase-shifted-signals of the plurality of phase-shifted-signals has a non-selected-transition-value; and
the transition-terminal is disconnected from the output-terminal at a second instant in time at which one or more of the non-selected phase-shifted-signals of the plurality of phase-shifted-signals has a non-selected-end-transition-value.

13. The transmission system of claim 12, wherein the switching-block further comprises:
a phase-select-switch configured to selectively provide one of the plurality of phase-shifted-signals to the transition-terminal of the output-switch as the selected phase-shifted-signal, and wherein the controller is configured to control the phase-select-switch such that the selected phase-shifted-signal is provided to the transition-terminal of the output-switch at the second instant in time that coincides with the selected phase-shifted-signal having a transition-predetermined-value.

14. The transmission system of claim 13, wherein the controller is further configured to:
process the plurality of phase-shifted-signals, a current-state-signal that is representative of a current state of the output-signal, and a transmit-command-signal that is representative of a trigger that a transition in the output-signal is required; and
provide a phase-select-control-signal for operating the phase-select-switch and an output-switch-control-signal for operating the output-switch.

15. A transmission system comprising:
an output-terminal configured to provide an output-signal;
a phase-shift oscillator comprising a plurality of phase-shifters, each phase shifter of the plurality of phase-shifters configured to provide a respective phase-shifted signal of a plurality of phase-shifted-signals; and
a controller configured to
provide a selected phase-shifted-signal from the plurality of phase-shifted-signals to the output-signal as a transition in the output-signal, at a first instant in time that is based on one or more of the plurality of phase-shifted-signals, and
selectively provide one of the plurality of phase-shifted-signals as the selected phase-shifted-signal at a second instant in time that coincides with one of the non-selected phase-shifted-signals having a non-selected-transition-value, wherein the non-selected phase-shifted-signal is 90° out of phase with the selected phase-shifted-signal, and the non-selected-transition-value is a middle-value.

* * * * *